US 11,056,925 B2

(12) United States Patent
Kondo et al.

(10) Patent No.: US 11,056,925 B2
(45) Date of Patent: Jul. 6, 2021

(54) WIRELESS POWER TRANSMITTING DEVICE, WIRELESS POWER RECEIVING DEVICE, AND WIRELESS POWER TRANSMISSION SYSTEM

(71) Applicant: TDK Corporation, Tokyo (JP)

(72) Inventors: Kazuki Kondo, Tokyo (JP); Kazunori Oshima, Tokyo (JP); Akira Gotani, Tokyo (JP); Narutoshi Fukuzawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 72 days.

(21) Appl. No.: 16/470,451

(22) PCT Filed: Dec. 20, 2017

(86) PCT No.: PCT/JP2017/045746
§ 371 (c)(1),
(2) Date: Jun. 17, 2019

(87) PCT Pub. No.: WO2018/123770
PCT Pub. Date: Jul. 5, 2018

(65) Prior Publication Data
US 2020/0091776 A1    Mar. 19, 2020

(30) Foreign Application Priority Data

Dec. 27, 2016  (JP) .............................. JP2016-253820

(51) Int. Cl.
*H02J 50/60* (2016.01)
*H02J 50/12* (2016.01)
*G01V 3/10* (2006.01)

(52) U.S. Cl.
CPC ............... *H02J 50/60* (2016.02); *G01V 3/10* (2013.01); *H02J 50/12* (2016.02)

(58) Field of Classification Search
None
See application file for complete search history.

(56) References Cited

U.S. PATENT DOCUMENTS

2013/0162054 A1    6/2013  Komiyama
2014/0015522 A1    1/2014  Widmer et al.
(Continued)

FOREIGN PATENT DOCUMENTS

JP    2012-244778 A    12/2012
JP    2013-132133 A     7/2013

OTHER PUBLICATIONS

International Search Report issued in corresponding International Patent Application No. PCT/JP2017/045746, dated Jan. 30, 2018, with English Translation.

*Primary Examiner* — Lincoln D Donovan
*Assistant Examiner* — Khareem E Almo
(74) *Attorney, Agent, or Firm* — McDermott Will & Emery LLP

(57) ABSTRACT

An object of the present invention is to reduce the possibility of failure in the detection of metallic foreign object. A metallic foreign object detector includes a sensor part having at least one antenna coil that receives a magnetic field or current to generate a vibration signal a vibration time length measurement circuit that measures a vibration time length indicating the length of time required for the vibration of the vibration signal output from the sensor part corresponding to a predetermined wavenumber larger than 1, and a determination circuit that determines the presence/absence of a metallic foreign object approaching the antenna coil based on the vibration time length and a criterion vibration time length which is the vibration time length obtained in the absence of the approaching metallic foreign object.

27 Claims, 11 Drawing Sheets

(56) References Cited

U.S. PATENT DOCUMENTS

| | | | | |
|---|---|---|---|---|
| 2014/0291404 A1* | 10/2014 | Matsuoka | ............... | H02J 50/10 |
| | | | | 235/462.46 |
| 2015/0137612 A1* | 5/2015 | Yamakawa | .............. | H01Q 7/08 |
| | | | | 307/104 |
| 2019/0386492 A1* | 12/2019 | Fukuzawa | ............... | H02J 7/025 |
| 2019/0393732 A1* | 12/2019 | Oshima | ................. | H02M 3/337 |
| 2020/0012007 A1* | 1/2020 | Oshima | ................... | H02J 50/12 |
| 2020/0076246 A1* | 3/2020 | Fukuzawa | ............... | H02J 50/60 |

* cited by examiner

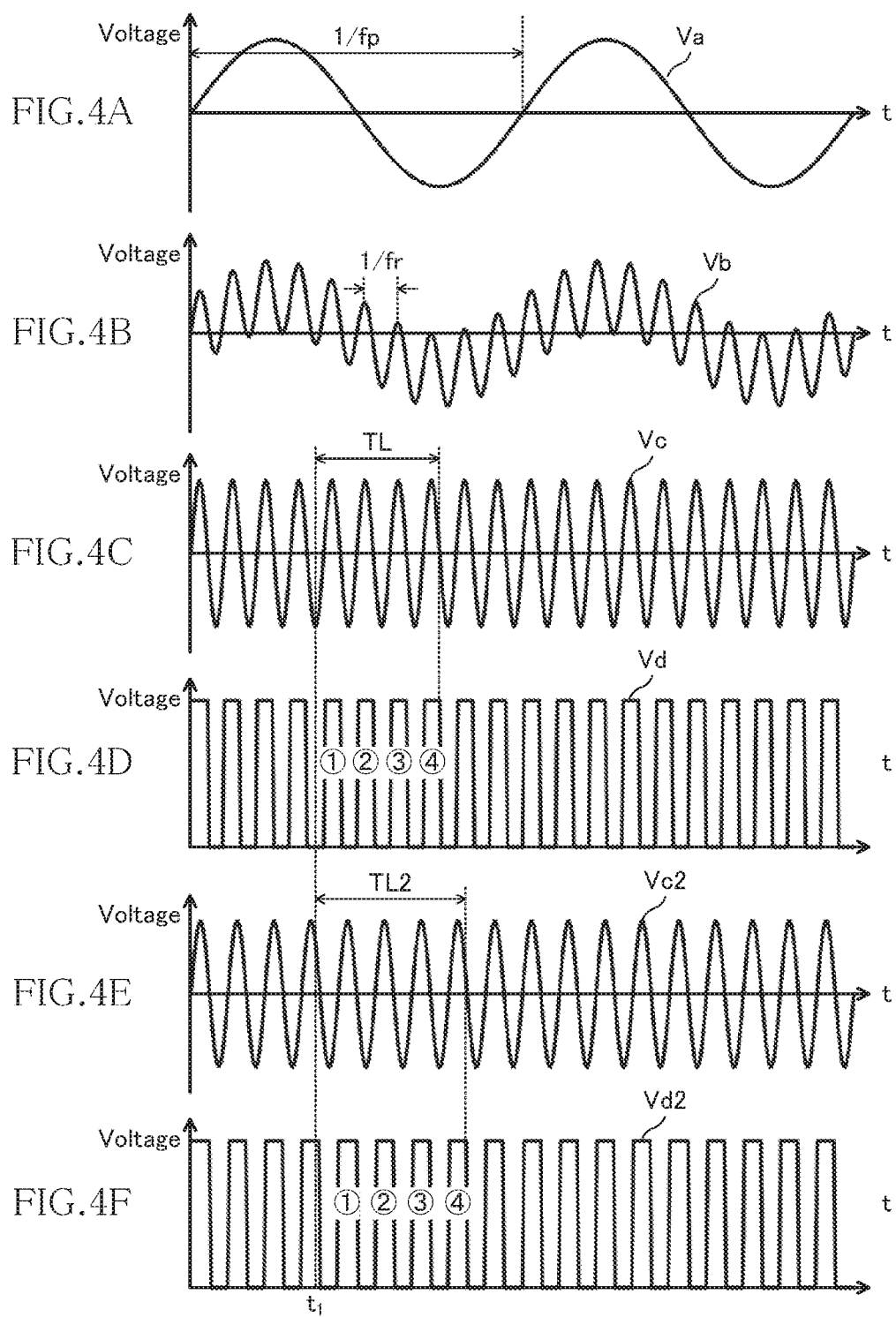

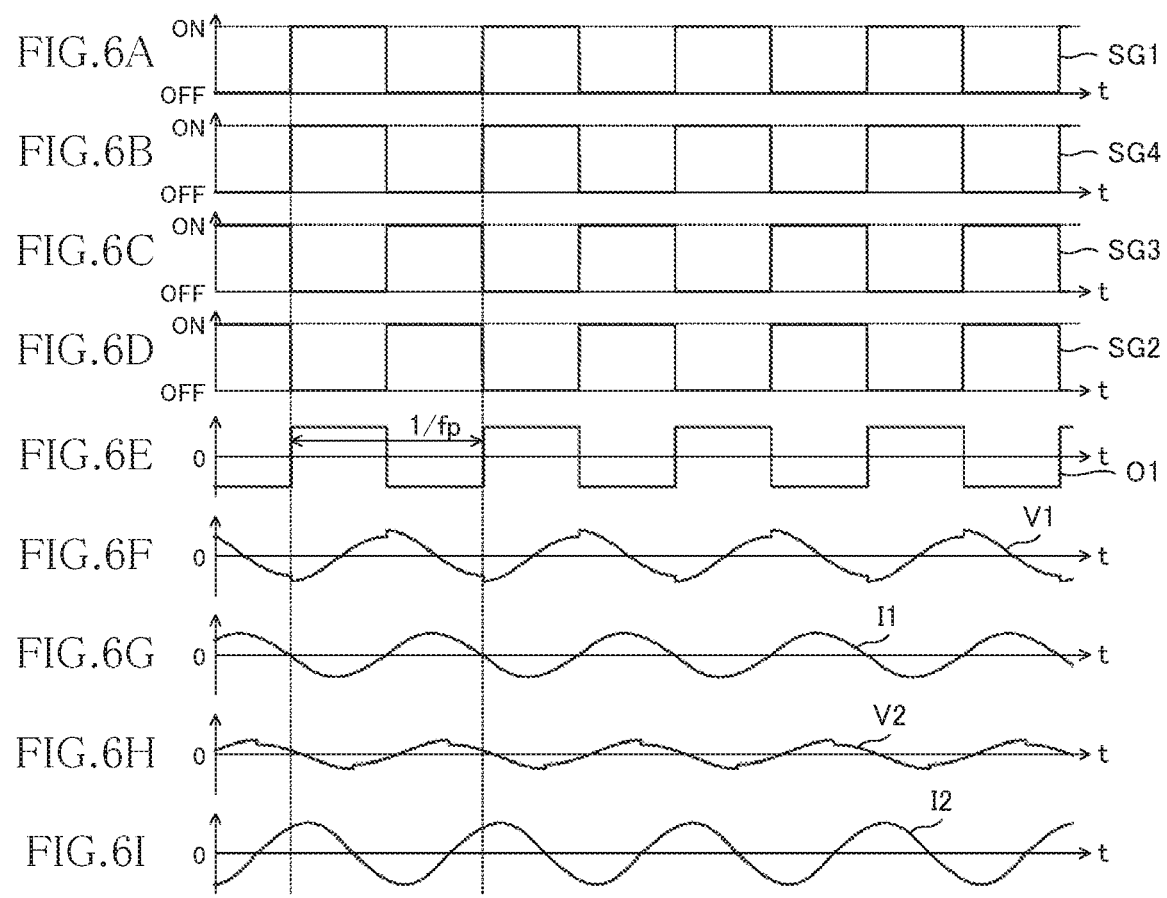

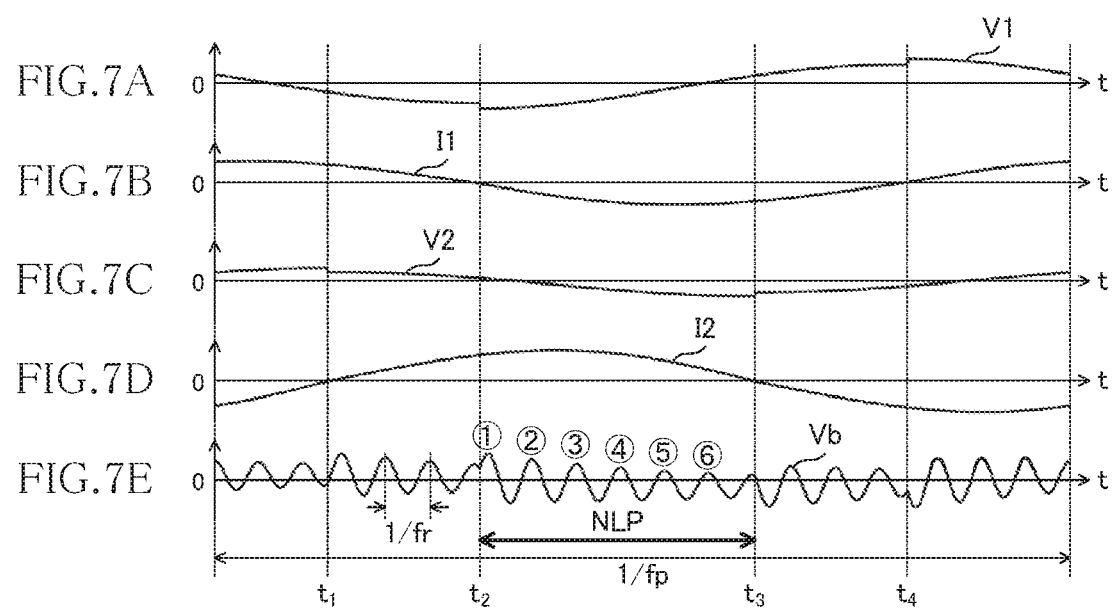

Difference Absolute Value > Threshold Value

Difference Absolute Value < Threshold Value

WIRELESS POWER TRANSMITTING DEVICE, WIRELESS POWER RECEIVING DEVICE, AND WIRELESS POWER TRANSMISSION SYSTEM

CROSS REFERENCE

This application is the U.S. National Phase under 35 US.C. § 371 of International Application No. PCT/JP2017/045746, filed on Dec. 20, 2017, which claims the benefit of Japanese Application No. 2016-253820, filed on Dec. 27, 2016, the entire contents of each are hereby incorporated by reference.

TECHNICAL FIELD

The present invention relates to a metallic foreign object detector, a wireless power transmitting device, a wireless power receiving device, and a wireless power transmission system.

BACKGROUND ART

In recent years, wireless power feeding adapted to feed power by wireless has been eagerly studied. There are various systems for realizing the wireless power feeding, and a system using a magnetic field is known as one of them. The system using a magnetic field includes an electromagnetic induction system and a magnetic field resonance system.

The electromagnetic induction system, which is already widely known, can perform power feeding with high efficiency due to a high coupling degree between a power transmitting device for feeding power and a power receiving device for receiving power. On the other hand, the magnetic field resonance system is a system that actively uses a resonance phenomenon, so that the coupling degree between the power transmitting device and the power receiving device may be low, and power feeding can be achieved.

The electromagnetic induction system and magnetic field resonance system both perform power feeding by using magnetism. Thus, in both the systems, the power transmitting device has a feeding coil for feeding power by using magnetism, and the power receiving device has a receiving coil for receiving power by using magnetism. The feeding coil and the receiving coil are magnetically coupled to each other, whereby power is fed from the power transmitting device to power receiving device.

When a metallic foreign object enters between the magnetically coupled feeding coil and receiving coil, an eddy current flows in the metallic foreign object by magnetic flux, resulting in heat generation in the metallic foreign object, which deteriorates power feeding efficiency. Thus, it is necessary to detect the metallic foreign object entering between the power transmitting device and the power receiving device.

Patent Document 1 discloses a detector provided with a Q-value measurement coil applied with a pulse and a resonance circuit including a capacitor and configured to detect the presence/absence of a metallic foreign object by measuring the Q-value of the resonance circuit from a response waveform output therefrom.

Patent Document 2 discloses a device provided with a sense loop and a coupling circuit constituting a resonance circuit together with the sense loop and configured to detect the presence/absence of a foreign object based on a change in the characteristic (resonance frequency, Q-value, or another characteristic from which a frequency at which the sense loop resonates is determined) of the resonance circuit.

CITATION LIST

Patent Document

[Patent Document 1] JP 2013-132133 A
[Patent Document 2] US 2014/0015522 A

SUMMARY OF INVENTION

Technical Problem to be Solved by Invention

The characteristics to be referred to when detecting a foreign object from the characteristic change of the resonance circuit as in the disclosure of Patent Document 2 may include the period of the response waveform. The use of the period is advantageous in terms of easiness of measurement since it can be calculated only by measuring time from one rising of the waveform to the next rising thereof.

However, a change in the period of the response waveform due to the presence of the foreign object is very little, so that the above method of referring to the period of the response waveform may fail to detect a change in the period even though the metallic foreign object actually exists between the feeding coil and the receiving coil, i.e., may fail to detect the metallic foreign object.

The present invention has been made in view of the above problem, and the object thereof is to reduce the possibility of failure in the detection of metallic foreign object.

Means for Solving the Problem

A metallic foreign object detector according to the present invention includes a sensor part having at least one antenna coil that receives a magnetic field or current to generate a vibration signal, a vibration time length measurement circuit that measures a vibration time length indicating the length of time required for the vibration of the vibration signal output from the sensor part corresponding to a predetermined wavenumber larger than 1, and a determination circuit that determines the presence/absence of a metallic foreign object approaching the antenna coil based on the vibration time length and a criterion vibration time length which is the vibration time length obtained in the absence of the approaching metallic foreign object.

According to the present invention, the presence/absence of a metallic foreign object is determined based on the vibration time length which is larger in the amount of change due to the presence of the metallic foreign object between a feeding coil and a receiving coil than the period, thus making it possible to reduce the possibility of failure in the metallic foreign object detection.

In the metallic foreign object detector, the start point of the measurement of vibration time length by the vibration time length measurement circuit may be made freely adjustable, and the predetermined wavenumber may be made freely adjustable. This improves the accuracy of detection of the metallic foreign object.

A wireless power transmitting device according to the present invention is a device that transmits power by wireless from a feeding coil to a receiving coil and includes the feeding coil and any one of the above metallic foreign object detectors. According to the present invention, there can be provided a wireless power transmitting device having a metallic foreign object detector capable of reducing the possibility of failure in the metallic foreign object detection.

The above wireless power transmitting device may further include a noise detection part that detects noise vibrating at a frequency higher than a frequency used in the power transmission, and the metallic foreign object detector may further include a control circuit that determines at least one of the measurement start point of the vibration time length and the predetermined wavenumber based on a noise detection result from the noise detection part, and that sets the at least one of the measurement start point of the vibration time length and the predetermined wavenumber to the vibration time length measurement circuit. This allows the presence/absence of a metallic foreign object to be determined without being influenced by noise.

In the wireless power transmitting device, the metallic foreign object detector may include a drive circuit that applies voltage to the at least one antenna coil, a detection circuit that measures the power transmission frequency and detects the phase of voltage generated in the at least one antenna coil by the power transmission, and a control circuit that controls the timing of the voltage application performed by the drive circuit based on the power transmission frequency measured by the detection circuit and the phase of voltage detected by the detection circuit. This allows synchronization between the phase of the voltage generated in the antenna coil by the power transmission and voltage application timing by the drive circuit, thus improving detection accuracy during power transmission.

A wireless power receiving device according to the present invention is a device that transmits power by wireless from a feeding coil to a receiving coil and includes the receiving coil and any one of the above metallic foreign object detectors. According to the present invention, there can be provided a wireless power receiving device having a metallic foreign object detector capable of reducing the possibility of failure in the metallic foreign object detection.

The above wireless power receiving device may further include a noise detection part that detects noise vibrating at a frequency higher than a frequency used in the power transmission, and the metallic foreign object detector may further include a control circuit that determines at least one of the measurement start point of the vibration time length and the predetermined wavenumber based on a noise detection result from the noise detection part. This allows the presence/absence of a metallic foreign object to be determined without being influenced by noise.

In the wireless power receiving device, the metallic foreign object detector may include a drive circuit that applies voltage to the at least one antenna coil, a detection circuit that measures the power transmission frequency and detects the phase of voltage generated in the at least one antenna coil by the power transmission, and a control circuit that controls the timing of the voltage application performed by the drive circuit based on the power transmission frequency measured by the detection circuit and the phase of voltage detected by the detection circuit. This allows synchronization between the phase of the voltage generated in the antenna coil by the power transmission and the timing of the voltage application performed by the drive circuit, thus improving detection accuracy during power transmission.

A wireless power transmission system according to the present invention is a system that transmits power by wireless from a feeding coil to a receiving coil and includes a wireless power transmitting device having the feeding coil and a wireless power receiving device having the receiving coil. At least one of the wireless power transmitting device and the wireless power receiving device has any one of the above metallic foreign object detectors. According to the present invention, there can be provided a wireless power transmission system having a metallic foreign object detector capable of reducing the possibility of failure in the metallic foreign object detection in at least one of the wireless power transmitting device and the wireless power receiving device.

The above wireless power transmission system may further include a noise detection part that detects noise vibrating at a frequency higher than a frequency used in the power transmission, and the metallic foreign object detector may further include a control circuit that determines at least one of the measurement start point of the vibration time length and the predetermined wavenumber based on a noise detection result output from the noise detection part. This allows the presence/absence of the metallic foreign object to be determined without being influenced by noise.

In the wireless power transmission system, the metallic foreign object detector may include a drive circuit that applies voltage to the at least one antenna coil, a detection circuit that measures the power transmission frequency and detects the phase of voltage generated in the at least one antenna coil by the power transmission, and a control circuit that controls the timing of the voltage application performed by the drive circuit based on the power transmission frequency measured by the detection circuit and the phase of voltage detected by the detection circuit. This allows synchronization between the phase of the voltage generated in the antenna coil by the power transmission and the timing of the voltage application performed by the drive circuit, thus improving detection accuracy during power transmission.

Advantageous Effects of the Invention

According to the present invention, it is possible to reduce the possibility of failure in the metallic foreign object detection.

BRIEF DESCRIPTION OF DRAWINGS

FIGS. 4A to 4F are views illustrating the waveforms of various signals concerning the metallic foreign object detector 14A illustrated in FIG. 2.

FIGS. 6A to 6i are views illustrating the waveforms of the control signals SG1-SG4, output voltage O1, voltages V1, V2, and currents I1, I2 illustrated in FIG. 2.

FIGS. 7A to 7E are views illustrating the waveforms of the voltages V1, V2 and currents I1, I2, illustrated in FIG. 2, and vibration signal Vb illustrated in FIG. 3.

MODE FOR CARRYING OUT THE INVENTION

Figure 1:
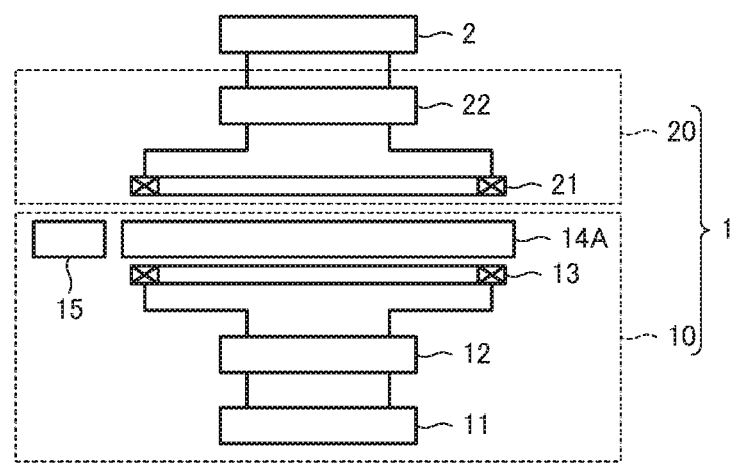
FIG. 1 is a view illustrating the schematic configuration of a wireless power transmission system 1 according to a first embodiment of the present invention and a load 2 connected to the wireless power transmission system 1.

Hereinafter, embodiments of the present invention will be described in detail with reference to the accompanying drawings. The present invention is not limited by the content described below. Further, constituent elements of the following embodiments include those easily occur to those skilled in the art, and include those substantially identical or equivalent in the scope thereof. Furthermore, in the following description, the same reference numerals are given to the same elements or elements having the same function, and repeated description will be omitted.

First Embodiment

FIG. 1 is a view illustrating the schematic configuration of a wireless power transmission system 1 according to the first embodiment of the present invention and a load 2 connected to the wireless power transmission system 1. As illustrated, the wireless power transmission system 1 includes a wireless power transmitting device 10 and a wireless power receiving device 20. The load 2 is connected to the wireless power receiving device 20.

The wireless power transmission system 1 is a system used for power feeding to a moving body such as an electric vehicle (EV) or a hybrid vehicle (HV) that utilizes power from a secondary battery. In this case, the wireless power transmitting device 10 is mounted in power feeding facility installed on the ground, and the wireless power receiving device 20 is mounted on the vehicle. The following description will be given assuming that the wireless power transmission system 1 is a system for power feeding to the electric vehicle.

Figure 2:
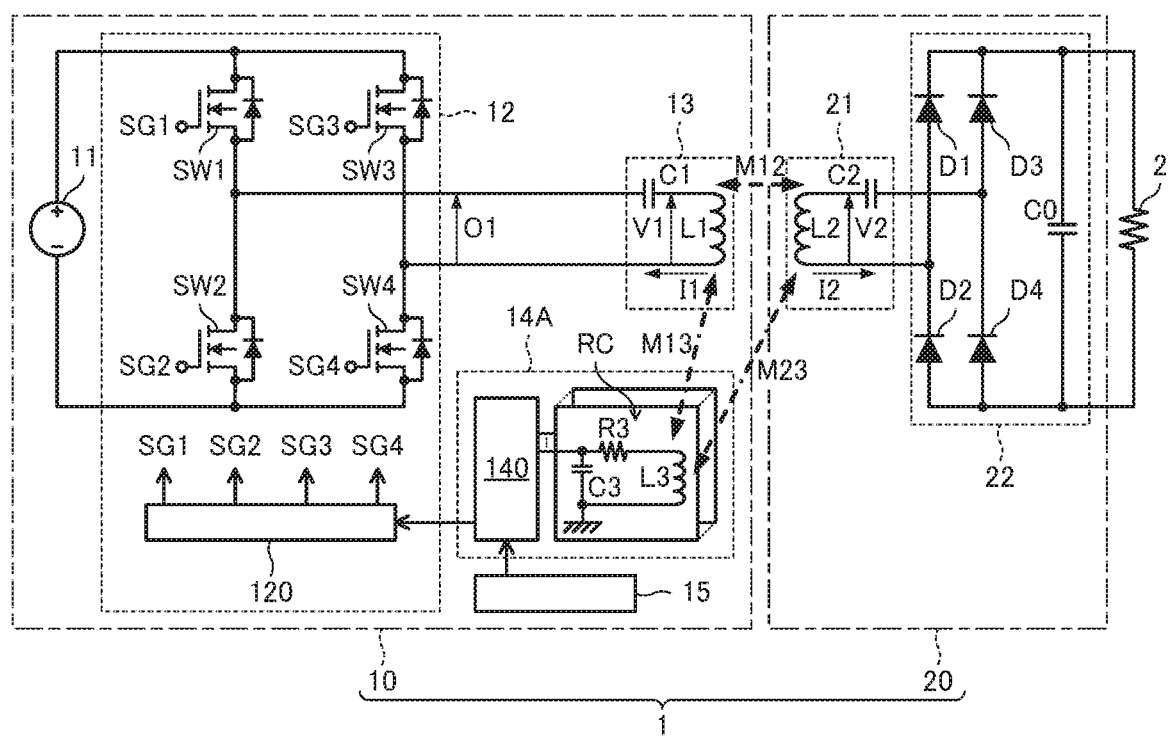
FIG. 2 is a view illustrating the internal circuit configurations of the wireless power transmitting device 10 and wireless power receiving device 20 illustrated in FIG. 1, respectively.

FIG. 2 is a view illustrating the internal circuit configurations of the wireless power transmitting device 10 and wireless power receiving device 20, respectively. Hereinafter, with reference to FIGS. 1 and 2, the outline of the configuration of the wireless power transmission system 1 will be described first, followed by detailed description of the characteristic configuration of the present invention.

As illustrated in FIGS. 1 and 2, the wireless power transmitting device 10 includes a DC power supply 11, a power converter 12, a feeding coil part 13, a metallic foreign object detector 14A, and a noise detection part 15. Although the metallic foreign object detector 14A is provided in the wireless power transmitting device 10 in the present embodiment, it may be provided in the wireless power receiving device 20.

The DC power supply 11 supplies DC power to the power converter 12. The DC power supply 11 is not particularly limited in type as long as it can supply DC power. For example, a DC power supply obtained by rectifying/smoothing a commercial AC power supply, a secondary battery, a DC power supply generated by solar power, and a switching power supply such as a switching converter can be suitably used as the DC power supply 11.

The power converter 12 is an inverter that converts the DC power supplied from the DC power supply 11 into AC power to thereby supply AC current I1 illustrated in FIG. 2 to the feeding coil part 13. Specifically, as illustrated in FIG. 2, the power converter 12 includes a switching circuit (full-bridge circuit) including a plurality of bridge-connected switching elements SW1 to SW4 and a switch drive part 120. Although the switching circuit in the power converter 12 is constituted by the full-bridge circuit in this example, other type of switching circuit may be used.

The switching elements SW1 to SW4 are configured to perform ON/OFF operation independently of each other by control signals SG1 to SG4 supplied from the switch drive part 120 to the gates thereof, respectively. Specifically, each of the switching elements SW1 to SW4 is brought into an ON state when an associated one of the control signals SG1 to SG4 is activated, and is brought into an OFF state when an associated one of the control signals SG1 to SG4 is deactivated. A MOSFET (Metal Oxide Semiconductor Field Effect Transistor) and an IGBT (Insulated Gate Bipolar Transistor) can be suitably used as the switching elements SW1 to SW4.

The switch drive part 120 is a signal generation part that generates the control signals SG1 to SG4 so that the output voltage of the switching circuit including the switching elements SW1 to SW4 becomes AC voltage of a predetermined frequency. Accordingly, the AC voltage of a predetermined frequency is supplied to a feeding coil L1 to be described later. Hereinafter, the predetermined frequency is referred to as "power transmission frequency fp". The value of the power transmission frequency fp is set to, e.g., 20 [kHz] to 200 [kHz].

As illustrated in FIG. 2, the feeding coil part 13 is a resonance circuit (feeding side resonance circuit) including a feeding side capacitor C1 and a feeding coil L1 which are connected in series and generates an alternating magnetic field based on the AC voltage supplied from the power converter 12. The resonance frequency of the feeding side resonance circuit constituting the feeding coil part 13 is set to a frequency equal or close to the above-mentioned power transmission frequency fp. The feeding side capacitor C1 may be connected parallel to the feeding coil L1.

The feeding coil L1 is a spiral structure coil formed by planarly winding, by about several turns to about several tens of turns, a litz wire obtained by twisting about two thousand insulated copper wires each having a diameter of φ0.1 (mm) and is disposed, e.g., in or near the ground. When AC voltage is supplied from the power converter 12 to the feeding coil L1, the AC current I1 illustrated in FIG. 2 flows in the feeding coil L1, whereby the alternating magnetic field is generated. The alternating magnetic field causes electromotive force to be generated in a receiving coil L2 to be described later by a mutual inductance M12 between the feeding coil L1 and the receiving coil L2, whereby power transmission is achieved.

The metallic foreign object detector 14A is a device having a function of detecting the presence/absence of a metallic foreign object approaching the feeding coil L1 and includes, as illustrated in FIG. 2, a plurality of resonance circuits RC each including an antenna coil L3 and a capacitor C3 for metallic foreign object detector and a detection part 140 connected to the resonance circuits. A resistor R3 illustrated in FIG. 2 is a series resistor of the antenna coil L3.

The metallic foreign object detector 14A is provided for the purpose of detecting a metallic foreign object entering between the feeding coil L1 and the receiving coil L2. Thus, as illustrated in FIG. 1, at least apart (specifically, antenna coils L3) of the metallic foreign object detector 14A is disposed on the surface of the feeding coil L1 opposed to the receiving coil L2, i.e., between the feeding coil L1 and the receiving coil L2. The metallic foreign object detector 14A and feeding coil L1 may be formed as an integrated unit or as separate units. Details of the metallic foreign object detector 14A will be described later.

The noise detection part 15 is configured to detect noise having a frequency higher than the power transmission frequency fp. The specific configuration of the noise detection part 15 is not particularly limited and, for example, the noise detection part 15 preferably includes a current detection circuit that detects a current waveform flowing in the feeding coil L1, a high-pass filter that extracts only a high-frequency component from an output signal from the current detection circuit, and a synchronization signal generation part that issues a synchronization signal when the amplitude of the output signal of the high-pass filter exceeds a predetermined value, i.e., during the generation period of the high-frequency component. In place of the current detection circuit, a voltage detection circuit such as a resistance-voltage dividing circuit may be used. The cut-off frequency of the high-pass filter is preferably set to a frequency higher than the power transmission frequency fp. Besides, the noise detection part 15 may be configured by disposing a magnetic sensor such as a hall element or a magnetoresistance effect element between the feeding coil L1 and the receiving coil L2.

The wireless power receiving device 20 includes a receiving coil part 21 and a rectifier 22, as illustrated in FIGS. 1 and 2.

As illustrated in FIG. 2, the receiving coil part 21 includes a resonance circuit (receiving side resonance circuit) including a receiving side capacitor C2 and a receiving coil L2 which are connected in series and plays a role as a power receiving part that receives AC power transmitted from the feeding coil L1 by wireless. The resonance frequency of the receiving side resonance circuit constituting the receiving coil part 21 is also set to a frequency equal or close to the above-mentioned power transmission frequency fp. The receiving side capacitor C2 may be connected parallel to the receiving coil L2.

Like the feeding coil L1, the receiving coil L2 is a spiral structure coil formed by planarly winding, by about several turns to about several tens of turns, a litz wire obtained by twisting about two thousand insulated copper wires each having a diameter of $\phi$ 0.1 (mm). On the other hand, the mounting position of the receiving coil L2 differs from that of the feeding coil L1 and, for example, the receiving coil L2 is mounted to the lower portion of the body of an electric vehicle. When magnetic flux generate by the feeding coil L1 interlinks the receiving coil L2, electromotive force by electromagnetic induction is generated in the receiving coil L2, whereby AC current I2 illustrated in FIG. 2 flows in the receiving coil L2. The AC current I2 is converted into DC current by the rectifier 22 and is then supplied to the load 2. Thus, the DC power can be supplied to the load 2.

The rectifier 22 is a circuit that rectifies the AC current output from the receiving coil part 21 into DC current to supply DC power to the load 2. Specifically, as illustrated in FIG. 2, the rectifier 22 includes a bridge circuit including four bridge-connected diodes D1 to D4 and a smoothing capacitor C0 connected parallel to the bridge circuit.

The load 2 includes a charger and a battery which are not illustrated. The charger is a circuit that charges the battery based on the DC power output from the rectifier 22. The charging is executed by, e.g., constant-voltage/constant-current charging (CVCC charging). The battery is not particularly limited in type as long as it can store power. For example, a secondary battery (lithium-ion battery, a lithium-polymer battery, a nickel battery, etc.) and a capacitive element (electric double-layer capacitor, etc.) can be suitably used as the battery constituting the load 2.

Figure 3:
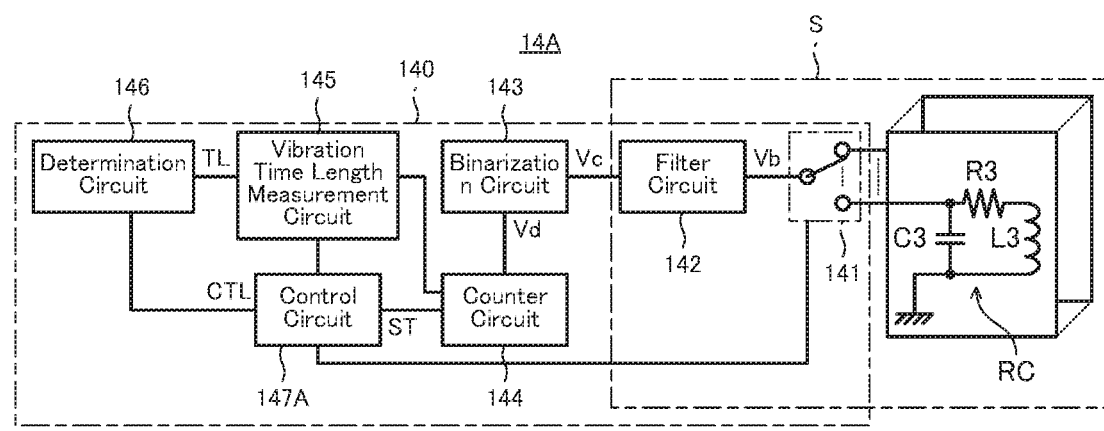
FIG. 3 is a schematic block diagram illustrating the functional block of the metallic foreign object detector 14A illustrated in FIG. 2.
Figure 5A:
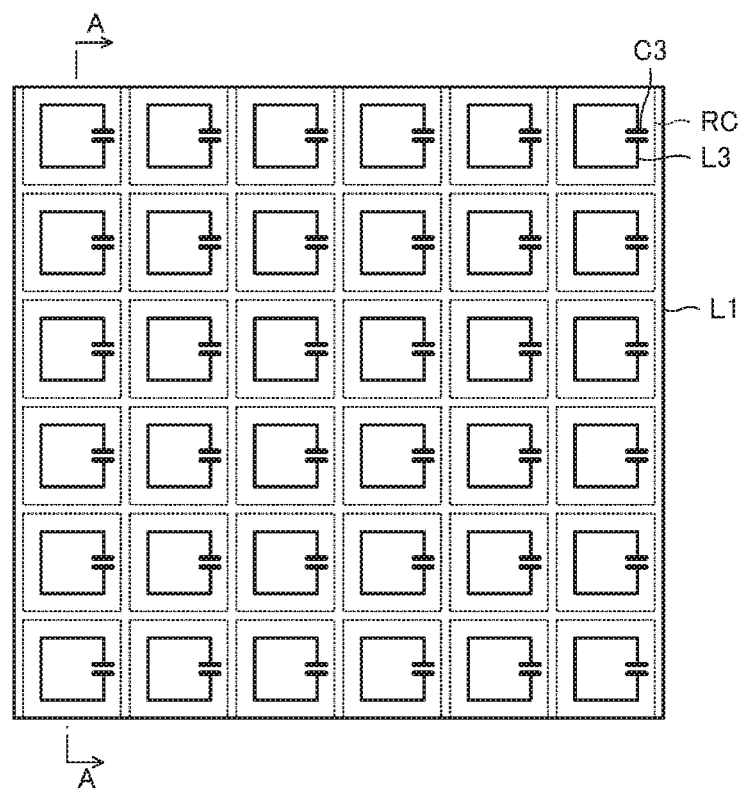
FIG. 5A is a plan view illustrating the positional relationship between the feeding coil L1 and the antenna coils L3 illustrated in FIG. 2.
Figure 5B:
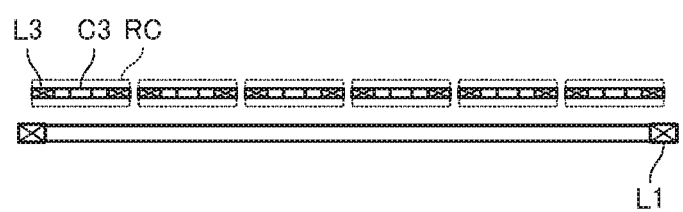
FIG. 5B is a cross-sectional view of the feeding coil L1 and the antenna coils L3 taken along line A-A of FIG. 5A.

The following describes details of the metallic foreign object detector 14A with reference to FIG. 3, FIGS. 4A to 4D, and FIGS. 5A and 5B. FIG. 3 is a schematic block diagram illustrating the functional block of the metallic foreign object detector 14A. FIGS. 4A to 4F are views illustrating the waveforms of various signals concerning the metallic foreign object detector 14A. FIG. 5A is a plan view illustrating the positional relationship between the feeding coil L1 and the antenna coils L3, and FIG. 5B is a cross-sectional view of the feeding coil L1 and the antenna coils L3 taken along line A-A of FIG. 5A.

Referring first to FIGS. 5A and 5B, the plurality of resonance circuits RC are arranged in a matrix within an area corresponding to the inside of the feeding coil L1, as viewed from above. Such an arrangement of the resonance circuits RC can be realized by placing, on the feeding coil L1, a printed board (not illustrated) on the surface of which a conductive coil pattern is formed.

With the above arrangement, when the above-mentioned alternating magnetic field (magnetic field vibrating at the power transmission frequency fp) occurs in the feeding coil L1, electromotive force is induced in the antenna coils L3 by a mutual inductance M13 between the feeding coil L1 and the antenna coils L3 illustrated in FIG. 2 and a mutual inductance M23 between the receiving coil L2 and the antenna coils L3 illustrated in FIG. 2. The electromotive force generates a vibration signal Vb in the antenna coils L3. That is, the antenna coils L3 according to the present embodiment are configured to generate a vibration signal by receiving a magnetic field.

The vibration signal generated in each antenna coil L3 contains, in addition to the component of the power transmission frequency fp which is the frequency of the alternating magnetic field, the component of the resonance frequency fr of each resonance circuit RC. The value of the resonance frequency fr is set to a single value extremely higher than the power transmission frequency fp by adjusting the inductance of the antenna coil L3 and the capacitance of the capacitor C3. Specifically, the value of the resonance frequency fr is preferably set to 3000 [kHz]. The capacitance of the capacitor C3 is preferably set to a value of about several hundreds [pF] to several thousands [pF].

FIG. 4A illustrates a signal Va vibrating at the power transmission frequency fp, and FIG. 4B illustrates a vibration signal Vb generated in each resonance circuit RC. FIGS. 4A and 4B reveal that the vibration signal Vb is a signal obtained by superimposing the component of the resonance frequency fr on the signal Va vibrating at the power transmission frequency fp. Although details will be described later, the detection part 140 of the metallic foreign object detector 14A extracts only the component of the resonance frequency fr from the vibration signal Vb and detects the metallic foreign object existing between the feeding coil L1 and the receiving coil L2 by utilizing a change in the component of the resonance frequency fr.

In the present embodiment, the resonance circuit RC is constituted by installing the capacitor C3 in series or parallel with each antenna coil L3. Alternatively, however, a configuration in which the capacitor C3 is not provided may be adopted. That is, the resonance circuit RC may not necessarily be formed. In this case, not the vibration signal Vb illustrated in FIG. 4B, but the signal Va illustrated in FIG. 4A is input to the detection part 140, so that the detection part 140 cannot utilize a change in the component of the resonance frequency fr for the metallic foreign object detection. Thus, in this case, the detection part 140 detects the metallic foreign object existing between the feeding coil L1 and the receiving coil L2 by utilizing a change in the component of the power transmission frequency fp.

Referring to FIG. 3, the detection part 140 functionally includes a detection changeover switch 141, a filter circuit 142, a binarization circuit 143, a counter circuit 144, a vibration time length measurement 145, a determination circuit 146, and a control circuit 147A. The detection changeover switch 141 and the filter circuit 142 constitute a sensor part S together with each resonance circuit RC.

The detection changeover switch 141 is a one-circuit multicontact type switch having a common terminal connected to the filter circuit 142 and a plurality of selection terminals connected to each resonance circuit RC and is configured to connect one of the selection terminals to the common terminal according to control performed by the control circuit 147A. As the detection changeover switch 141, a semiconductor switch or a multiplexer is preferably used.

The control circuit 147A functions as an antenna coil selection part that sequentially selects the antenna coils L3 one by one at an equal time interval. After selecting the last antenna coil L3, the control circuit 147A repeats the selection operation from the first antenna coil L3. The detection changeover switch 141 plays a role of connecting the selection terminal corresponding to the antenna coil L3 selected by the control circuit 147A to the common terminal. With this configuration, the antenna coils L3 are sequentially connected one by one to the filter circuit 142.

The control circuit 147A may be configured to exclude some of the plurality of antenna coils L3 from the selection target coils according to the user's setting or the like. This allows an area to be subjected to the metallic foreign object detection to be narrowed to increase detection time of the metallic foreign object by one antenna coil L3 as compared to a case where all the antenna coils L3 are used.

While the capacitor C3 is provided for each antenna coil L3 in the present embodiment, the total number of the capacitors C3 may be only one. In this case, only the antenna coil L3 that is connected to the filter circuit 142 by switching of the detection changeover switch 141 constitutes the resonance circuit RC together with the one capacitor C3. This configuration can reduce the number of the capacitors C3, which in turn can reduce the number of components constituting the metallic foreign object detector 14A. When the capacitor C3 is provided for each antenna coil L3, a switch for switching the connection between the antenna coil L3 and the capacitor C3 may be provided for each of the resonance circuits RC and configured so as to disconnect, at the time of the metallic foreign object detection, the capacitor C3 from each of the antenna coils L3 other than the one that is connected to the filter circuit 142 by switching of the detection changeover switch 141. This suppresses magnetic coupling between the antenna coil L3 connected to the filter circuit 142 by switching of the detection changeover switch 141 and other antenna coils L3 during the metallic foreign object detection, making it possible to further improve the accuracy of detection of the metallic foreign object.

The control circuit 147A performs the metallic foreign object detection operation by utilizing the selected antenna coil L3. Specifically, the control circuit 147A performs the detection operation by controlling the vibration time length measurement circuit 145 and the determination circuit 145 in the manner as described below. The detection operation is repeated one or more times while one antenna coil L3 is being selected by the control circuit 147A.

The filter circuit 142 is a circuit that generates a vibration signal Vc illustrated in FIG. 4C by removing the component of the power transmission frequency fp from the vibration signal Vb generated in the antenna coil L3 connected thereto through the detection changeover switch 141. Specifically, the filter circuit 142 may be constituted by a band-pass filter that extracts a frequency of the same band as the resonance frequency fr. On the other hand, when the capacitor C3 is not provided, that is, when the resonance circuit RC is not constituted, it is preferable to constitute the filter circuit 142 by a band-pass filter that extracts a frequency of the same band as the power transmission frequency fp.

The binarization circuit 143 compares the voltage value of the vibration signal Vc output from the filter circuit 142 and a reference voltage value set in advance to generate a binary signal Vd illustrated in FIG. 4D. The binary signal Vd assumes a high level when the voltage value of the vibration signal Vc is equal to or larger than the reference voltage value (e.g., 0 V) and assumes a low level when the voltage value of the vibration signal Vc is smaller than the reference voltage value.

The counter circuit 144 counts the wavenumber of the binary signal Vd output from the binarization circuit 143 to thereby count the wavenumber of the vibration signal Vc. The timing at which the counter circuit 144 starts counting is designated by a count start signal ST supplied from the control circuit 147A.

The vibration time length measurement circuit 145 is a circuit that measures a vibration time length TL indicating the length of time required for the vibration of the vibration signal Vc corresponding to a predetermined wavenumber larger than 1. The wavenumber mentioned here is equivalent to the period of the vibration signal Vc. FIG. 4C illustrates, as one example, the vibration time length TL of the vibration of the vibration signal Vc corresponding to four wavenumbers. The start point of the measurement of the vibration time length TL by the vibration time length measurement circuit 145 and the wavenumber of the vibration signal Vc to be referred to for measurement of the vibration time length TL can be freely adjusted by the control circuit 147A. Details of the operation of the control circuit 147A for the adjustment will be described later.

The measurement of the vibration time length by the vibration time length measurement circuit 145 is achieved by measuring time required for the increment of the count value of the counter circuit 144 after the start of the measurement is instructed by the control circuit 147A to reach the wavenumber designated by the control circuit 147A. In the example of FIGS. 4A to 4F, the start time of the measurement instructed by the control circuit 147A is time $t_1$, and the wavenumber designated by the control circuit 147A is 4. In this case, the vibration time length TL measured by the vibration time length measurement circuit 145 is represented by time required for the count value (circled numbers 1 to 4) from the time $t_1$ to reach 4.

FIGS. 4E and 4F illustrate examples of a vibration signal Vc2 and a binary signal Vd2 generated by the same filter circuit 142 when the status of the presence/absence of the metallic foreign object between the feeding coil L1 and the receiving coil L2 differs from that in FIGS. 4C and 4D. A vibration time length TL2 illustrated in FIGS. 4E and 4F corresponds to the vibration of the vibration signal Vc2 corresponding to four wavenumbers. As can be seen from comparison between the vibration time length TL2 and the vibration time length TL illustrated in FIG. 4C, a difference in the status of the presence/absence of the metallic foreign object between the feeding coil L1 and the receiving coil L2 causes a change in the vibration time length TL1. Thus, it is possible to detect the presence/absence of the metallic foreign object between the feeding coil L1 and the receiving coil L2 by detecting a change in the vibration time length TL.

Further, the vibration time length TL indicates the length of time required for the vibration of the vibration signal Vc corresponding to a predetermined wavenumber larger than 1, so that a change in the vibration time length TL when the status of the presence/absence of the metallic foreign object between the feeding coil L1 and the receiving coil L2 is larger than a change in the period of the vibration signal Vc in the same case. For example, when the vibration time length TL is represented by the length of time required for the vibration of the vibration signal Vc corresponding to four wavenumbers as in the example of FIG. 4C, a change of about four times a change in the period can be obtained. In other words, by using the vibration time length TL, it is possible to amplify the change. Thus, according to the present embodiment, it is possible to reduce the possibility of failure in the metallic foreign object detection due to excessively small change.

The control circuit 147A has a function of determining the measurement start point of the vibration time length TL and the wavenumber of the vibration signal Vc to be referred to for the measurement of the vibration time length TL based on the noise detection result output from the noise detection part 15 illustrated in FIG. 2 and setting the determined measurement start point and wavenumber in the vibration time length measurement circuit 145. Hereinafter, detailed description will be made on this point with reference to FIGS. 6A to 6I and FIGS. 7A to 7E.

FIGS. 6A to 6E are views illustrating the waveforms of the control signals SG1, SG4, SG3, and SG2 and output voltage O1 (output voltage from the power converter 12) illustrated in FIG. 2. In FIGS. 6A to 6E, a period during which the signals are "ON" corresponds to a period during which the corresponding switching elements are in a closed state, and a period during which the signals are "OFF" corresponds to a period during which the corresponding switching elements are in an opened state. As illustrated, the control signals SG1 to SG4 are rectangular wave signals vibrating at the power transmission frequency fp, and the control signals SG1 and SG4 differ in phase from the control signals SG2 and SG3 by 180°. As a result, the output voltage O1 is also a rectangular wave signal vibrating at the power transmission frequency fp.

FIGS. 6F and 6G are views illustrating the waveforms of voltage V1 between both ends of the feeding coil L1 and current I1 flowing in the feeding coil L1. FIGS. 6H and 6I are views illustrating the waveforms of voltage V2 between both ends of the receiving coil L2 and current I2 flowing in the receiving coil L2. As illustrated in FIGS. 6F, 6G, 6H, and 6I, the voltage V1, voltage V2, current I1, and current I2 are substantially sine wave signals vibrating at the power transmission frequency fp. This is because a high-frequency component is filtered by the resonance circuit constituted of the feeding side capacitor C1 and feeding coil L1.

However, as can be seen from FIG. 6F, a new high-frequency component is generated in the voltage V1 at the switching timing of the switching elements SW1 to SW4. Correspondingly, a high-frequency component is contained in each of the voltage V2, current I1, and current I2. These high-frequency components have influence on the vibration signal Vb generated in the antenna coil L3.

FIGS. 7A to 7E are views illustrating the waveforms of the voltage V1, voltage V2, current I1, current I2, and vibration signal Vb. FIGS. 7A to 7E represent one period of the power transmission frequency fp. As illustrated, particularly at timing (times $t_1$, $t_2$, $t_3$, and $t_4$, in the example of FIGS. 7A to 7E) when a high frequency component is superimposed on the voltage V1 and V2, a large distortion (distortion caused due to the alternating magnetic field for power transmission) occurs in the waveform of the vibration signal Vb. Such a distortion causes reduction in the detection accuracy of the foreign object. Thus, the control circuit 147A determines the start point of the measurement of the vibration time length TL and the wavenumber of the vibration signal Vc to be referred to for the measurement of the vibration time length TL such that the metallic foreign object detection is performed at the timing at which such a distortion will be generated as little as possible.

More specifically, the control circuit 147A predicts the timing at which a large distortion due to the alternating magnetic field for power transmission does not occur in the vibration signal Vb from the history of the noise detection result obtained by the noise detection part 15. In the example of FIGS. 7A to 7E, a period between the time $t_2$ and time $t_3$ (hereinafter, referred to as "noiseless period NLP") corresponds to the timing at which a large distortion due to the alternating magnetic field for power transmission does not occur in the vibration signal Vb. The noiseless period NLP is caused by the switching of the switching elements SW1 to SW4 or switching of current paths flowing in the diodes D1 to D4 and thus appears periodically. The control circuit 147A acquires the appearance period of the periodically appearing noiseless period NLP from the history of the noise detection result to predict the appearance timing of the next noiseless period NLP. Then, based on the prediction result, the control circuit 147A determines the start point of the measurement of the vibration time length TL and the wavenumber of the vibration signal Vc to be referred to for the measurement of the vibration time length TL such that the detection of the metallic foreign object is performed within the next noiseless period NLP.

Specifically, for example, the control circuit 147A may determine the start point of the measurement of the vibration time length TL and the wavenumber of the vibration signal Vc to be referred to for the measurement of the vibration time length TL such that the vibration time length TL is measured by using the vibration denoted by the circled numbers 2 to 6 illustrated in FIG. 7E. That is, the control circuit 147A may set the start point of the measurement of the vibration time length TL between the circled numbers 1 and 2 and set the wavenumber of the vibration signal Vc to be referred to for the measurement of the vibration time length TL to 5. This allows the metallic foreign object detection to be performed within the noiseless period NLP during which a large distortion due to the alternating magnetic field for power transmission does not occur in the vibration signal Vb. Thus, it is possible to improve the detection accuracy of the metallic foreign object between the feeding coil L1 and the receiving coil L2 during wireless power feeding.

Referring back to FIG. 3, the control circuit 147A also performs operation for acquiring a criterion time length CTL serving as a criterion for the vibration time length TL. The criterion time length CTL is a value of the vibration time length TL when the metallic foreign object is absent between the feeding coil L1 and the receiving coil L2. The control circuit 147A executes the above control in a state where the absence of the metallic foreign object between the feeding coil L1 and the receiving coil L2 is guaranteed to acquire the criterion time length CTL. At this time, the control circuit 147A determines the measurement start point of the vibration time length TL and the wavenumber of the vibration signal Vc to be referred to for the measurement of the vibration time length TL in the same manner as when the vibration time length TL is acquired in normal operation. Accordingly, the vibration time length TL and the criterion time length CTL can be considered to be acquired under the same noise condition. The control circuit 147A outputs the acquired criterion time length CTL to the determination circuit 146 and stores the value CTL therein.

The determination circuit 146 is a circuit that detects the presence/absence of the metallic foreign object between the feeding coil L1 and the receiving coil L2 based on the vibration time length TL supplied from the vibration time length measurement circuit 145 and the criterion time length CTL supplied in advance from the control circuit 147A and stored therein. Specifically, when the absolute value of the difference between the vibration time length TL and the criterion time length CTL falls within a predetermined value, the determination circuit 146 determines the absence of the metallic foreign object, and otherwise, it determines the presence thereof.

Figure 8A:
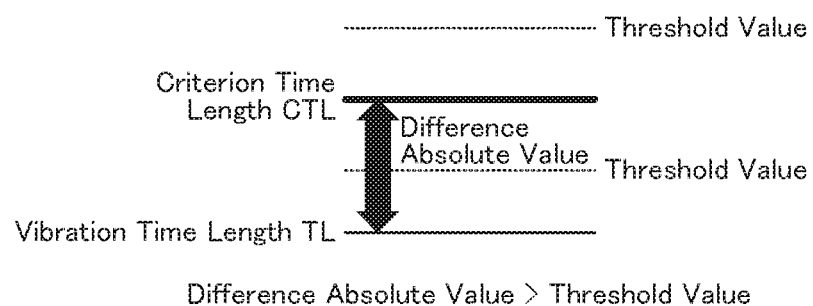
FIGS. 8A and 8B are views for explaining determination processing performed by the determination circuit 146 illustrated in FIG. 3.
Figure 8B:
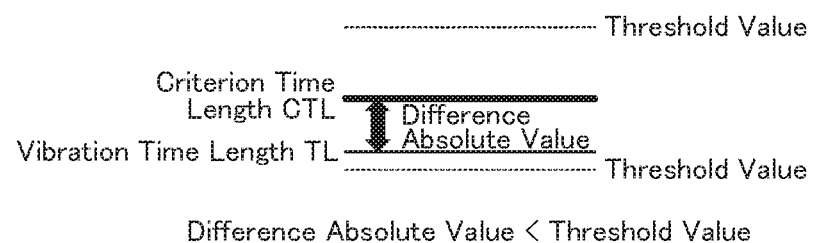

FIGS. 8A and 8B are views for explaining determination processing performed by the determination circuit 146. FIG. 8A illustrates a case where the metallic foreign object is present, and FIG. 8B illustrates a case where the metallic foreign object is absent. With reference to FIGS. 8A and 8B, the determination processing performed by the determination circuit 146 will be described below in greater detail. First, the determination circuit 146 calculates the absolute value of the difference (difference absolute value) between the vibration time length TL and the criterion vibration time length CTL. Then, when the difference absolute value exceeds a predetermined threshold value as illustrated in FIG. 8A, the determination circuit 146 determines that the metallic foreign object is present between the feeding coil L1 and the receiving coil L2 (metallic foreign object approaching the feeding coil L1 is present). On the other hand, when the difference absolute value is equal to or less than a predetermined threshold value as illustrated in FIG. 8B, the determination circuit 146 determines that the metallic foreign object is absent between the feeding coil L1 and the receiving coil L2 (metallic foreign object approaching the feeding coil L1 is absent).

Referring back to FIG. 3, the determination result output from the determination circuit 146 is supplied to the control circuit 147A. When the determination result indicates the presence of the metallic foreign object, the control circuit 147A instructs the switch drive part 120 illustrated in FIG. 2 to stop electric power conversion performed in the power converter 12. Upon receiving the instruction, the switch drive part 120 adjusts the control signals SG1 to SG4 illustrated in FIG. 2 so as not to allow AC power to be output from the power converter 12. As a result, the power feeding operation by the wireless power transmitting device 10 is stopped, making it possible to prevent an eddy current from occurring in the metallic foreign object due to an alternating magnetic field generated between the feeding coil L1 and the receiving coil L2, which in turn prevents the metallic foreign object from generating heat.

As described above, the metallic foreign object detector 14A of the present embodiment determines the presence/absence of the metallic foreign object based on the vibration time length TL which is larger in the amount of change due to the presence of the metallic foreign object between the feeding coil L1 and the receiving coil L2 than the period, thus making it possible to reduce the possibility of failure in the metallic foreign object detection.

Further, the control circuit 147A predicts the noiseless period NLP from the history of the noise detection result output from the noise detection part 15 and determines the start point of the measurement of the vibration time length TL and wavenumber of the vibration signal Vc to be referred to for the measurement of the vibration time length TL such that the detection of the metallic foreign object is performed within the next noiseless period NLP. Thus, according to the metallic foreign object detector 14A of the present embodiment, it is possible to improve the detection accuracy of the metallic foreign object between the feeding coil L1 and the receiving coil L2 during wireless power feeding.

Second Embodiment

The following describes the wireless power transmission system 1 according to a second embodiment of the present invention. The wireless power transmission system 1 according to the present embodiment differs from the wireless power transmission system 1 according to the first embodiment in that it uses a metallic foreign object detector 14B in place of the metallic foreign object detector 14A. Other configurations are the same as those of the wireless power transmission system 1 according to the first embodiment, so the same reference numerals are given to the same components as in the first embodiment, and description will be made focusing only on the difference from the first embodiment.

Figure 9:
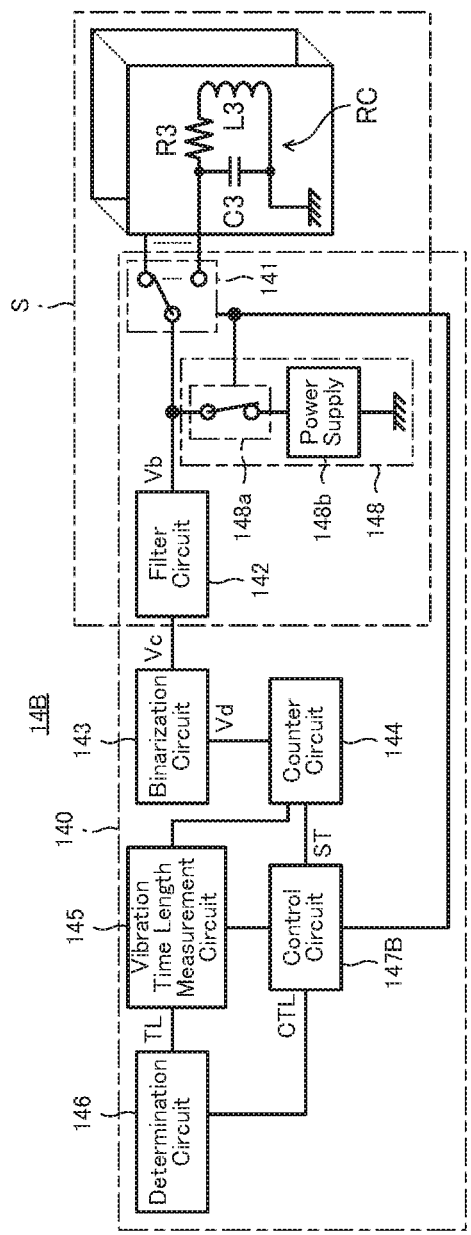
FIG. 9 is a schematic block diagram illustrating the functional block of the metallic foreign object detector 14B according to a second embodiment of the present invention.

FIG. 9 is a schematic block diagram illustrating the functional block of the metallic foreign object detector 14B according to the present embodiment. As illustrated, the metallic foreign object detector 14B of the present embodiment additionally has a drive circuit 148 in the detection part 140 and has a control circuit 147B in place of the control circuit 147A. The drive circuit 148 is a circuit that supplies current to the antenna coils L3, and each of the antenna coils L3 is configured to receive the current supplied from the drive circuit 148 and thus to generate the vibration signal Vb.

The drive circuit 148 will be described more in detail. As illustrated in FIG. 9, the drive circuit 148 includes a switching circuit 148a and a power supply 148b.

The switching circuit 148a is a one-circuit one-contact type switch having a terminal connected to the power supply 148b and a terminal connected to the common terminal of the detection changeover switch 141 and is configured to perform open/close operation according to control performed by the control circuit 147B. As the switching circuit 148a, a bipolar transistor or a MOSFET is preferably used.

The power supply 148b is a power supply for making current flow in the antenna coil L3 and may be a DC power supply or an AC power supply. The following description will be given assuming that the power supply 148b is a DC power supply. One end of the power supply 148b is connected to the switching circuit 148a, and the other end thereof is grounded.

The control circuit 147B according to the present embodiment performs the control of the switching circuit 148a, in addition to the control of the detection changeover switch 141. Specifically, the control circuit 147B selects one antenna coil L3, and the selected antenna coil L3 is connected to the filter circuit 142 by the operation of the detection changeover switch 141. Thereafter, the control circuit 147B brings the switching circuit 148a to a closed state and restores the switching circuit 148a to an opened state after the elapse of a predetermined time. As a result, current is supplied from the power supply 148b to the antenna coil L3. By the thus supplied current, the vibration signal Vb is generated in the antenna coil L3 and supplied to the filter circuit 142.

The operation of the resonance circuit RC when the current is supplied to the antenna coil L3 will be described in detail. By DC current supplied from the power supply 148b while the switching circuit 148a is in a closed state, magnetic energy is accumulated in the antenna coil L3. When the switching circuit 148a is brought to an opened state, attenuation vibration is generated by the magnetic energy. Thus, the vibration signal Vb according to the present embodiment contains a component attenuated while vibrating at the resonance frequency fr of each resonance circuit RC.

In the present embodiment, while the alternating magnetic field generated in the feeding coil L1 is not necessarily required for the operation of the metallic foreign object detector 14B, the vibration signal Vb when the alternating magnetic field is generated (during power feeding) contains the component of the power transmission frequency fp in addition to the above-mentioned component. Also in the present embodiment, the filter circuit 142 plays a role of extracting a power transmission frequency fp from the vibration signal Vb.

Figure 10:
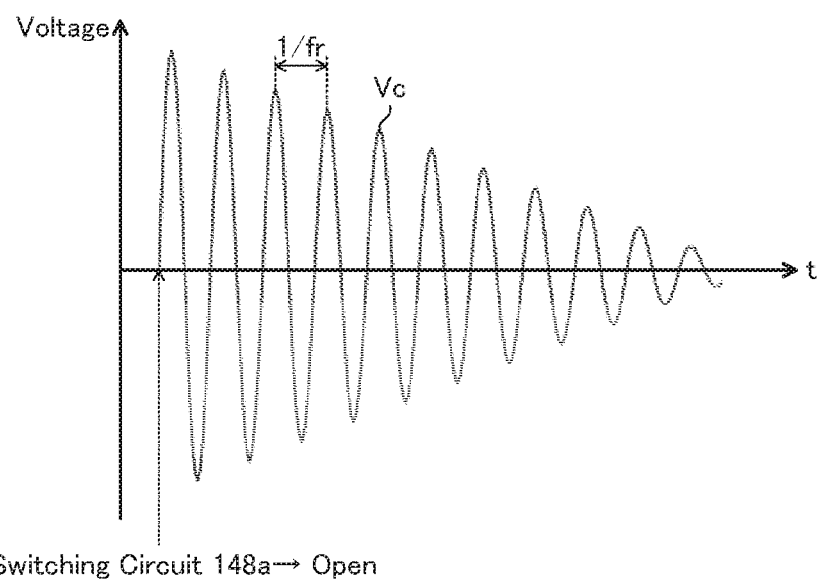
FIG. 10 is a view illustrating the waveform of the vibration signal Vc according to the second embodiment of the present invention.

FIG. 10 is a view illustrating the waveform of the vibration signal Vc (output signal from the filter circuit 142) according to the present embodiment. As illustrated, the vibration signal Vc according to the present embodiment is an attenuated vibration signal that starts attenuating from the moment when the switching circuit 148a is in an opened state. Like the vibration signal Vc according to the first embodiment, the frequency of the vibration signal Vc coincides with the resonance frequency fr of the resonance circuit RC. As already described in the first embodiment, the resonance frequency fr is a frequency extremely higher than the power transmission frequency fp.

The vibration time length measurement circuit 145 measures the vibration time length TL with respect to the vibration signal Vc which is the attenuation vibration signal according to the method described in the first embodiment. Further, the determination circuit 146 determines the presence/absence of the metallic foreign object based on the measured vibration time length TL according to the method described in the first embodiment. Thus, also in the present embodiment, it is possible to reduce the possibility of failure in the metallic foreign object detection.

In addition to the function of determining the start point of the measurement of the vibration time length TL and the wavenumber of the vibration signal Vc to be referred to for the measurement of the vibration time length TL such that the detection of the metallic foreign object is performed within the next noiseless period NLP and setting the determined measurement start point and the wavenumber in the vibration time length measurement circuit 145, the control circuit 147B according to the present embodiment has a function of determining the timing of closing the switching circuit 148a such that current supply to the resonance circuit RC is performed within the noiseless period NLP. Specifically, the control circuit 147B may determine the start point of the measurement of the vibration time length TL and the wavenumber of the vibration signal Vc to be referred to for the measurement of the vibration time length TL such that the switching circuit 148a is closed immediately after the start of the noiseless period NLP to start current supply and, then, the vibration time length TL is measured within the noiseless period NLP. This allows execution of a series of processes from the current supply to the antenna coil L3 to the measurement of the vibration time length TL within the noiseless period NLP.

As described above, the metallic foreign object detector 14B of the present embodiment determines the presence/absence of the metallic foreign object based on the vibration time length TL which is larger in the amount of change due to the presence of the metallic foreign object between the feeding coil L1 and the receiving coil L2 than the period, thus making it possible to reduce the possibility of failure in the metallic foreign object detection.

Further, the control circuit 147B predicts the noiseless period NLP from the history of the noise detection result obtained by the noise detection part 15 and determines the closing timing of the switching circuit 148a, the start point of the measurement of the vibration time length TL and the wavenumber of the vibration signal Vc to be referred to for the measurement of the vibration time length TL such that the detection of the metallic foreign object is performed within the next noiseless period NLP. Thus, according to the metallic foreign object detector 14B of the present embodiment, it is possible to improve the accuracy of detection of the metallic foreign object between the feeding coil L1 and the receiving coil L2 during wireless power feeding.

Further, according to the present embodiment, the vibration signal Vb can be generated in the antenna coil L3 without the alternating magnetic field generated in the feeding coil L1, thereby allowing the metallic foreign object entering between the feeding coil L1 and the receiving coil L2 to be detected even in a period (during interruption of power feeding) during which the wireless power transmitting device 10 does not perform power transmission. In this case, noise associated with the switching of the switching elements SW1 to SW4 is not generated, allowing the control circuit 147B to close the switching circuit 148a at any timing.

Third Embodiment

The following describes the wireless power transmission system 1 according to a third embodiment of the present invention. The wireless power transmission system 1 according to the present embodiment differs from the wireless power transmission system 1 according to the second embodiment in that it uses a metallic foreign object detector 14C in place of the metallic foreign object detector 14B. Other configurations are the same as those of the wireless power transmission system 1 according to the second embodiment, so the same reference numerals are given to the same components as in the second embodiment, and description will be made focusing only on the difference from the second embodiment.

Figure 11:
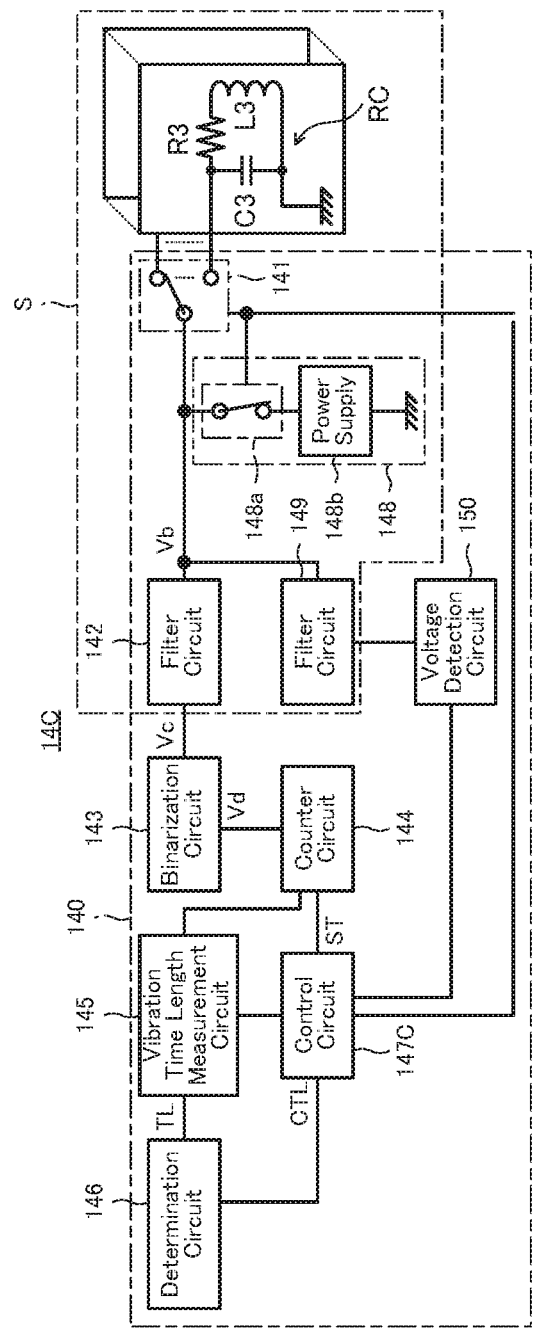
FIG. 11 is a schematic block diagram illustrating the functional block of the metallic foreign object detector 14C according to a third embodiment of the present invention.

FIG. 11 is a schematic block diagram illustrating the functional block of the metallic foreign object detector 14C according to the present embodiment. As illustrated, the metallic foreign object detector 14C additionally has a filter circuit 149 and a voltage detection circuit 150 in the detection part 140 and has a control circuit 147C in place of the control circuit 147B.

The filter circuit 149 allows the passage of only a frequency component of the same band as the power transmission frequency fp included in the vibration signal Vb generated in the antenna coil L3 connected thereto through the detection switching switch 141.

The voltage detection circuit 150 is a circuit that measures a frequency (i.e., power transmission frequency fp) used in power transmission performed by the wireless power transmission system 1 and detects the phase of voltage generated in the antenna coil L3 by the power transmission of the wireless power transmission system 1. Alternatively, the voltage detection circuit 150 may measure the frequency used in power transmission performed by the wireless power transmission system 1 and detect the phase of voltage generated in the antenna coil L3 by the power transmission of the wireless power transmission system 1 based on a binary signal obtained by binarizing the output signal of the filter circuit 149.

The control circuit 147C according to the present embodiment is configured to control voltage application timing (i.e., closing timing of the switching circuit 148a) by the drive circuit 148 based on the frequency measured by the voltage detection circuit 150 and the phase of the voltage detected by the voltage detection circuit 150. For example, the control circuit 147C makes the drive circuit 148 start voltage application after the elapse of a predetermined timer time from the timing at which the phase of the voltage generated in the antenna coil L3 is 0. This allows synchronization between the phase of the voltage generated in the antenna coil L3 by the power transmission and the voltage application timing by the drive circuit 148, thus improving measurement accuracy during power transmission.

The timer predetermined time may be fixed or adjusted in accordance with the frequency measured by the voltage detection circuit 150. In the latter case, the drive circuit 148 can start voltage application at a fixed phase irrespective of the power transmission frequency.

While the preferred embodiment of the present invention has been described, the present invention is not limited to the above embodiment and may be practiced in various forms without departing from the sprit and scope of the present invention.

REFERENCE SIGNS LIST 1 wireless power transmission system
2 load
10 wireless power transmitting device
11 DC power supply
12 power converter
13 feeding coil part
14A-14C metallic foreign object detector
15 noise detection part
20 wireless power receiving device
21 receiving coil part
22 rectifier
120 switch drive part
140 detection part
141 detection changeover switch
142 filter circuit
143 binarization circuit
144 counter circuit
145 vibration time length measurement circuit
146 determination circuit
147A-147C control circuit
148 drive circuit
148a switching circuit
148b power supply
C0 smoothing capacitor
C1 feeding side capacitor
C2 receiving side capacitor
C3 capacitor for metallic foreign object detector
CTL criterion time length
D1-D4 diode
L1 feeding coil
L2 receiving coil
L3 antenna coil
R3 resistor
RC resonance circuit
S sensor part
SW1-SW4 switching element
TL vibration time length

What is claimed is:

1. A wireless power transmitting device that transmits power by wireless from a feeding coil to a receiving coil, the wireless power transmitting device comprising:
   the feeding coil; and
   a metallic foreign object detector,
   wherein the metallic foreign object detector includes:
      a sensor part having at least one antenna coil that receives a magnetic field or current to generate a vibration signal;
      a vibration time length measurement circuit that measures a vibration time length indicating a length of time required for a vibration of the vibration signal output from the sensor part corresponding to a predetermined wavenumber larger than 1; and
      a determination circuit that determines a presence/absence of a metallic foreign object approaching the antenna coil based on the vibration time length and a criterion vibration time length which is a vibration time length obtained in an absence of the approaching metallic foreign object, and
   wherein a measurement time of the vibration time length is less than a period of a power transmission frequency.

2. The wireless power transmitting device as claimed in claim 1, further comprising a noise detection part that detects noise vibrating at a frequency higher than a frequency used in a power transmission,
   wherein the metallic foreign object detector further comprises a control circuit that determines at least one of a measurement start point of the vibration time length and the predetermined wavenumber based on a noise detection result from the noise detection part, and that sets the at least one of the measurement start point of the vibration time length and the predetermined wavenumber to the vibration time length measurement circuit.

3. The wireless power transmitting device as claimed in claim 1, wherein the metallic foreign object detector further comprises:
   a drive circuit that applies voltage to the at least one antenna coil;
   a detection circuit that measures the power transmission frequency and detects a phase of voltage generated in the at least one antenna coil by a power transmission; and
   a control circuit that controls a timing of a voltage application performed by the drive circuit based on the power transmission frequency measured by the detection circuit and the phase of voltage detected by the detection circuit.

4. A wireless power receiving device that transmits power by wireless from a feeding coil to a receiving coil, the wireless power receiving device comprising:
the receiving coil; and
a metallic foreign object detector,
wherein the metallic foreign object detector includes:
a sensor part having at least one antenna coil that receives a magnetic field or current to generate a vibration signal;
a vibration time length measurement circuit that measures a vibration time length indicating a length of time required for a vibration of the vibration signal output from the sensor part corresponding to a predetermined wavenumber larger than 1; and
a determination circuit that determines a presence/absence of a metallic foreign object approaching the antenna coil based on the vibration time length and a criterion vibration time length which is a vibration time length obtained in an absence of the approaching metallic foreign object, and
wherein a measurement time of the vibration time length is less than a period of a power transmission frequency.

5. The wireless power receiving device as claimed in claim 4, further comprising a noise detection part that detects noise vibrating at a frequency higher than a frequency used in a power transmission,
wherein the metallic foreign object detector further comprises a control circuit that determines at least one of a measurement start point of the vibration time length and the predetermined wavenumber based on a noise detection result from the noise detection part, and that sets the at least one of the measurement start point of the vibration time length and the predetermined wavenumber to the vibration time length measurement circuit.

6. The wireless power receiving device as claimed in claim 4, wherein the metallic foreign object detector further comprises:
a drive circuit that applies voltage to the at least one antenna coil;
a detection circuit that measures the power transmission frequency and detects a phase of voltage generated in the at least one antenna coil by a power transmission; and
a control circuit that controls a timing of a voltage application performed by the drive circuit based on the power transmission frequency measured by the detection circuit and the phase of voltage detected by the detection circuit.

7. A wireless power transmission system that transmits power by wireless from a feeding coil to a receiving coil, the wireless power transmission system comprising:
a wireless power transmitting device having the feeding coil; and
a wireless power receiving device having the receiving coil,
wherein at least one of the wireless power transmitting device and wireless power receiving device has a metallic foreign object detector,
wherein the metallic foreign object detector includes:
a sensor part having at least one antenna coil that receives a magnetic field or current to generate a vibration signal;
a vibration time length measurement circuit that measures a vibration time length indicating a length of time required for a vibration of the vibration signal output from the sensor part corresponding to a predetermined wavenumber larger than 1; and
a determination circuit that determines a presence/absence of a metallic foreign object approaching the antenna coil based on the vibration time length and a criterion vibration time length which is a vibration time length obtained in an absence of the approaching metallic foreign object, and
wherein a measurement time of the vibration time length is less than a period of the power transmission frequency.

8. The wireless power transmission system as claimed in claim 7, further comprising a noise detection part that detects noise vibrating at a frequency higher than a frequency used in a power transmission,
wherein the metallic foreign object detector further comprises a control circuit that determines at least one of a measurement start point of the vibration time length and the predetermined wavenumber based on a noise detection result from the noise detection part, and that sets the at least one of the measurement start point of the vibration time length and the predetermined wavenumber to the vibration time length measurement circuit.

9. The wireless power transmission system as claimed in claim 7, wherein the metallic foreign object detector further comprises:
a drive circuit that applies voltage to the at least one antenna coil;
a detection circuit that measures the power transmission frequency and detects a phase of voltage generated in the at least one antenna coil by a power transmission; and
a control circuit that controls a timing of a voltage application performed by the drive circuit based on the power transmission frequency measured by the detection circuit and the phase of voltage detected by the detection circuit.

10. The wireless power transmitting device as claimed in claim 1, wherein a start point of a measurement of vibration time length by the vibration time length measurement circuit is made freely adjustable.

11. The wireless power transmitting device as claimed in claim 1, wherein the predetermined wavenumber is made freely adjustable.

12. The wireless power receiving device as claimed in claim 4, wherein a start point of a measurement of vibration time length by the vibration time length measurement circuit is made freely adjustable.

13. The wireless power receiving device as claimed in claim 4, wherein the predetermined wavenumber is made freely adjustable.

14. The wireless power transmission system as claimed in claim 7, wherein a start point of a measurement of vibration time length by the vibration time length measurement circuit is made freely adjustable.

15. The wireless power transmission system as claimed in claim 7, wherein the predetermined wavenumber is made freely adjustable.

16. A wireless power transmitting device that transmits power by wireless from a feeding coil to a receiving coil, the wireless power transmitting device comprising:
the feeding coil; and
a metallic foreign object detector, wherein the metallic foreign object detector includes:
- a sensor part having at least one antenna coil that receives a magnetic field or current to generate a vibration signal;
- a vibration time length measurement circuit that measures a vibration time length indicating a length of time required for a vibration of the vibration signal output from the sensor part corresponding to a predetermined wavenumber larger than 1;
- a determination circuit that determines a presence/absence of a metallic foreign object approaching the antenna coil based on the vibration time length and a criterion vibration time length which is a vibration time length obtained in an absence of the approaching metallic foreign object;
- a drive circuit that applies voltage to the at least one antenna coil;
- a detection circuit that measures a power transmission frequency and detects a phase of voltage generated in the at least one antenna coil by a power transmission; and
- a control circuit that controls a timing of a voltage application performed by the drive circuit based on the power transmission frequency measured by the detection circuit and the phase of voltage detected by the detection circuit.

17. The wireless power transmitting device as claimed in claim 16, further comprising a noise detection part that detects noise vibrating at a frequency higher than a frequency used in a power transmission,
wherein the metallic foreign object detector farther comprises a control circuit that determines at least one of a measurement start point of the vibration time length and the predetermined wavenumber based on a noise detection result from the noise detection part, and that sets the at least one of the measurement start point of the vibration time length and the predetermined wavenumber to the vibration time length measurement circuit.

18. A wireless power receiving device that transmits power by wireless from a feeding coil to a receiving coil, the wireless power receiving device comprising:
the receiving coil; and
a metallic foreign object detector,
wherein the metallic foreign object detector includes:
- a sensor part having at least one antenna coil that receives a magnetic field or current to generate a vibration signal;
- a vibration time length measurement circuit that measures a vibration time length indicating a length of time required for a vibration of the vibration signal output from the sensor part corresponding to a predetermined wavenumber larger than 1;
- a determination circuit that determines a presence/absence of a metallic foreign object approaching the antenna coil based on the vibration time length and a criterion vibration time length which is a vibration time length obtained in an absence of the approaching metallic foreign object;
- a drive circuit that applies voltage to the at least one antenna coil;
- a detection circuit that measures a power transmission frequency and detects a phase of voltage generated in the at least one antenna coil by a power transmission; and
- a control circuit that controls a timing of a voltage application performed by the drive circuit based on the power transmission frequency measured by the detection circuit and the phase of voltage detected by the detection circuit.

19. The wireless power receiving device as claimed in claim 18, further comprising a noise detection part that detects noise vibrating at a frequency higher than a frequency used in a power transmission,
wherein the metallic foreign object detector further comprises a control circuit that determines at least one of a measurement start point of the vibration time length and the predetermined wavenumber based on a noise detection result from the noise detection part, and that sets the at least one of the measurement start point of the vibration time length and the predetermined wavenumber to the vibration time length measurement circuit.

20. A wireless power transmission system that transmits power by wireless from a feeding coil to a receiving coil, the wireless power transmission system comprising:
a wireless power transmitting device having the feeding coil; and
a wireless power receiving device having the receiving coil,
wherein at least one of the wireless power transmitting device and wireless power receiving device has a metallic foreign object detector, and
wherein the metallic foreign object detector includes:
- a sensor part having at least one antenna coil that receives a magnetic field or current to generate a vibration signal;
- a vibration time length measurement circuit that measures a vibration time length indicating a length of time required for a vibration of the vibration signal output from the sensor part corresponding to a predetermined wavenumber larger than 1;
- a determination circuit that determines a presence/absence of a metallic foreign object approaching the antenna coil based on the vibration time length and a criterion vibration time length which is a vibration time length obtained in an absence of the approaching metallic foreign object;
- a drive circuit that applies voltage to the at least one antenna coil;
- a detection circuit that measures a power transmission frequency and detects a phase of voltage generated in the at least one antenna coil by a power transmission; and
- a control circuit that controls a timing of a voltage application performed by the drive circuit based on the power transmission frequency measured by the detection circuit and the phase of voltage detected by the detection circuit.

21. The wireless power transmission system as claimed in claim 20, further comprising a noise detection part that detects noise vibrating at a frequency higher than a frequency used in a power transmission,
wherein the metallic foreign object detector further comprises a control circuit that determines at least one of a measurement start point of the vibration time length and the predetermined wavenumber based on a noise detection result from the noise detection part, and that sets the at least one of the measurement start point of the vibration time length and the predetermined wavenumber to the vibration time length measurement circuit.

22. The wireless power transmitting device as claimed in claim 16, wherein a start point of a measurement of vibration time length by the vibration time length measurement circuit is made freely adjustable.

23. The wireless power transmitting device as claimed in claim 16, wherein the predetermined wavenumber is made freely adjustable.

24. The wireless power receiving device as claimed in claim 18, wherein a start point of a measurement of vibration time length by the vibration time length measurement circuit is made freely adjustable.

25. The wireless power receiving device as claimed in claim 18, wherein the predetermined wavenumber is made freely adjustable.

26. The wireless power transmission system as claimed in claim 20, wherein a start point of a measurement of vibration time length by the vibration time length measurement circuit is made freely adjustable.

27. The wireless power transmission system as claimed in claim 20, wherein the predetermined wavenumber is made freely adjustable.

* * * * *